US012733275B2

(12) United States Patent
Kuo et al.

(10) Patent No.: US 12,733,275 B2
(45) Date of Patent: Sep. 8, 2026

(54) IMAGE SENSOR

(71) Applicant: VisEra Technologies Company Ltd., Hsin-Chu City (TW)

(72) Inventors: Shin-Hong Kuo, Hsin-Chu City (TW); Jian-Wen Luo, Hsin-Chu City (TW); Chun-Yuan Wang, Hsin-Chu City (TW); Hao-Wei Liu, Hsin-Chu City (TW); Po-Hsiang Wang, Hsin-Chu City (TW); Han-Lin Wu, Hsin-Chu City (TW); Hung-Jen Tsai, Hsin-Chu City (TW)

(73) Assignee: VISERA TECHNOLOGIES COMPANY LTD., Hsin-Chu City (TW)

( * ) Notice: Subject to any disclaimer, the term of this patent is extended or adjusted under 35 U.S.C. 154(b) by 352 days.

(21) Appl. No.: 18/629,379

(22) Filed: Apr. 8, 2024

(65) Prior Publication Data

US 2025/0318298 A1 Oct. 9, 2025

(51) Int. Cl.
*H10F 39/00* (2025.01)
*H10F 39/18* (2025.01)

(52) U.S. Cl.
CPC ......... *H10F 39/805* (2025.01); *H10F 39/024* (2025.01); *H10F 39/182* (2025.01); *H10F 39/8053* (2025.01)

(58) Field of Classification Search
CPC .. H10F 39/805; H10F 39/182; H10F 39/8053; H10F 39/024
USPC .......................................................... 257/437
See application file for complete search history.

(56) References Cited

U.S. PATENT DOCUMENTS

2018/0102389 A1 4/2018 Lee
2019/0064532 A1 2/2019 Riley, Jr. et al.
2020/0185443 A1 6/2020 Itabasi et al.
2022/0165763 A1* 5/2022 Kim ...................... H10F 39/807
2025/0226335 A1* 7/2025 Park .................... H10F 39/8053

FOREIGN PATENT DOCUMENTS

JP 2005018061 A 1/2005
JP 2006320807 A 11/2006
JP 2018519542 A 7/2018
JP 2021056338 A 4/2021
JP 2022183206 A 12/2022
JP 2023050071 A 4/2023
JP 2023107867 A 8/2023
JP 2023171792 A 12/2023

(Continued)

*Primary Examiner* — Igwe U Anya
(74) *Attorney, Agent, or Firm* — Muncy, Geissler, Olds & Lowe, P.C.

(57) ABSTRACT

The image sensor includes a photoelectric conversion layer, a color filter layer disposed on the photoelectric conversion layer, a buffer layer disposed on the color filter layer, a meta layer, and an anti-reflective layer coated on the meta layer. The meta layer includes a lining layer on the buffer layer and a plurality of top nano-structures protruded from the lining layer in a direction away from the photoelectric conversion layer. The anti-reflective layer includes a first portion on a top surface of a first nano-structure of the top nano-structures and a second portion on a sidewall of the first nano-structure, and a height of the first portion is greater than a width of the second portion.

20 Claims, 15 Drawing Sheets

(56) References Cited

FOREIGN PATENT DOCUMENTS

| | | | |
|---|---|---|---|
| JP | 2024012119 | A | 1/2024 |
| KR | 10-2009-0098004 | | 9/2009 |
| KR | 20240045950 | A | 4/2024 |
| TW | I757894 | B | 3/2022 |
| TW | 202327118 | A | 7/2023 |
| WO | WO-2023/013408 | A1 | 2/2023 |
| WO | WO-2023/064094 | A1 | 4/2023 |

* cited by examiner

IMAGE SENSOR

BACKGROUND

Field of Invention

The present disclosure relates to an image sensor. More particularly, the present disclosure relates to the image sensor with anti-reflection structure.

Description of Related Art

Accompanying with the development of semiconductor devices, the techniques of complementary metal oxide semiconductor (CMOS) image sensors (also known as CIS) with smaller dimensions are highly demanded. In CIS, the arrangements and dimensions of elements in an optical device would affect the focal length of light. The focal length of light would further affect the thicknesses of elements.

SUMMARY

An aspect of the disclosure provides an image sensor. The image sensor includes a photoelectric conversion layer, a color filter layer disposed on the photoelectric conversion layer, a buffer layer disposed on the color filter layer, a meta layer, and an anti-reflective layer coated on the meta layer. The meta layer includes a lining layer on the buffer layer and a plurality of top nano-structures protruded from the lining layer in a direction away from the photoelectric conversion layer. The anti-reflective layer includes a first portion on a top surface of a first nano-structure of the top nano-structures and a second portion on a sidewall of the first nano-structure, and a height of the first portion is greater than a width of the second portion.

In some embodiments, the height is measured at a center of the top surface of the first nano-structure in the direction away from the photoelectric conversion layer, and the width is measured at a middle of the sidewall of the first nano-structure in a direction that perpendicular to the direction away from the photoelectric conversion layer.

In some embodiments, the anti-reflective layer includes a third portion on a top surface of the lining layer, and a height of the third portion is greater than the width of the second portion.

In some embodiments, a ratio of the height of the first portion to the width of the second portion is greater than or equal to 1.2, and a ratio of the height of the third portion to the width of the second portion is greater than or equal to 1.3.

In some embodiments, a ratio of the height of the first portion to the width of the second portion is greater than or equal to 1.5, and a ratio of the height of the third portion to the width of the second portion is greater than or equal to 1.7.

In some embodiments, the first portion has a rounded corner, and a radius of curvature of the rounded corner is less than the height of the first portion.

In some embodiments, the first portion has a round head portion laterally protruded from the second portion.

In some embodiments, the anti-reflective layer is partially connected on the adjacent top nano-structures, and an air cavity encircled by the anti-reflective layer is between the adjacent top nano-structures.

In some embodiments, the image sensor further includes a protective layer on the anti-reflective layer, a refractive index of the anti-reflective layer is greater than a refractive index of the protective layer, and the refractive index of the protective layer is greater than 1.

In some embodiments, the image sensor further includes a top index matching layer between the anti-reflective layer and a top surface of the first nano-structure, a refractive index of the meta layer is greater than a refractive index of the top index matching layer, and the refractive index of the top index matching layer is greater than or equal to a refractive index of the anti-reflective layer.

In some embodiments, the image sensor further includes a bottom index matching layer between the buffer layer and a bottom surface of the lining layer, a refractive index of the meta layer is greater than a refractive index of the bottom index matching layer, and the refractive index of the bottom index matching layer is greater than or equal to a refractive index of the buffer layer.

In some embodiments, a thickness of the bottom index matching layer is smaller than or equal to a thickness of the top index matching layer.

In some embodiments, the image sensor further includes a top index matching layer between the anti-reflective layer and a top surface of the first nano-structure, wherein the anti-reflective layer is directly in contact with a top surface of a second nano-structure of the top nano-structures.

In some embodiments, the first nano-structure and the second nano-structure are located on a color filter region of the color filter layer.

In some embodiments, the first nano-structure and the second nano-structure are located on different color filter regions of the color filter layer, respectively.

In some embodiments, the anti-reflective layer includes a fourth portion on a top surface of the second nano-structure, and a sum of a thickness of the top index matching and the height of the first portion is greater than a height of the fourth portion.

In some embodiments, the anti-reflective layer includes a fourth portion on a top surface of a second nano-structure of the top nano-structures and a fifth portion on a sidewall of the second nano-structure, a height of the fourth portion is greater than a width of the fifth portion, and a first ratio of the height of the first portion to the width of the second portion is greater than a second ratio of the height of the fourth portion to the width of the fifth portion.

In some embodiments, a refractive index of the meta layer is greater than a refractive index of the anti-reflective layer, and the refractive index of the anti-reflective layer is greater than 1.

In some embodiments, the meta layer includes a plurality of bottom nano-structures protruded from the lining layer in a direction towards the photoelectric conversion layer, and the bottom nano-structures misalign the top nano-structures.

In some embodiments, the image sensor further includes an inter meta layer disposed in the buffer layer, an inter top index matching layer between the buffer layer and a top surface of a top nano-structure of the inter meta layer, and an inter bottom index matching layer between the buffer layer and a bottom surface of a lining layer of the inter meta layer.

The image sensor of the embodiments of the disclosure includes meta layer having nano-structures on the photoelectric conversion layer and an anti-reflective layer coated on the nano-structures to reduce the reflectivity of the nano-structures. The anti-reflective layer is non-conformally coated on the nano-structures of the meta layer to further reduce the reflectivity and increase optical effect.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
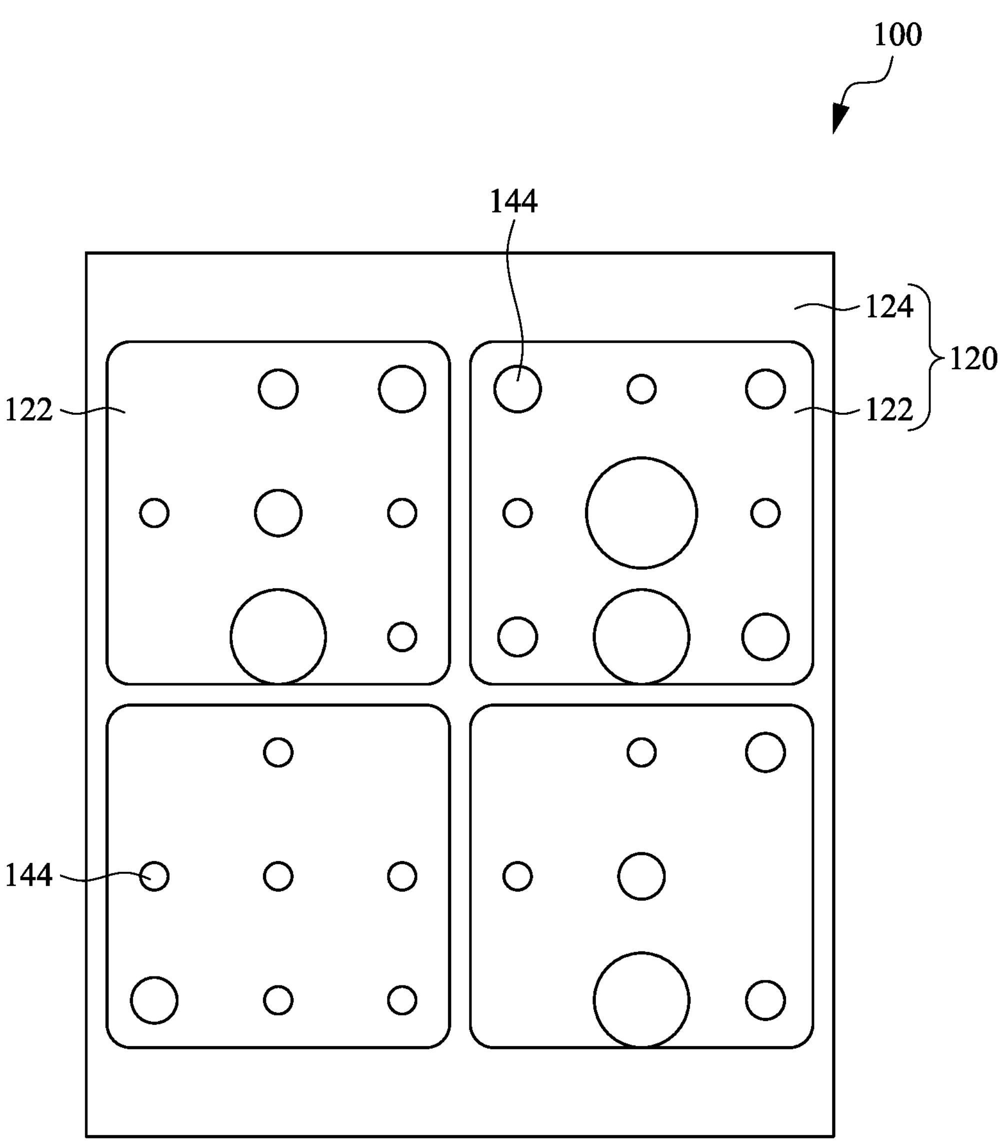
FIG. 1 is a schematic top view of an image sensor according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosed image sensor could reduce the focal length of light by tuning the phase difference. In some embodiments of the image sensor of the disclosure, the phase difference is tuned by a meta layer having nano-structures of high refractive index. The nano-structures of the image sensor of the disclosure are further coated with an anti-reflective layer to reduce the reflectivity of the nano-structures. More particularly, the anti-reflective layer is non-conformally coated on the nano-structures of the meta layer of the image sensor of the disclosure to further reduce the reflectivity and increase optical effect.

Figure 2:
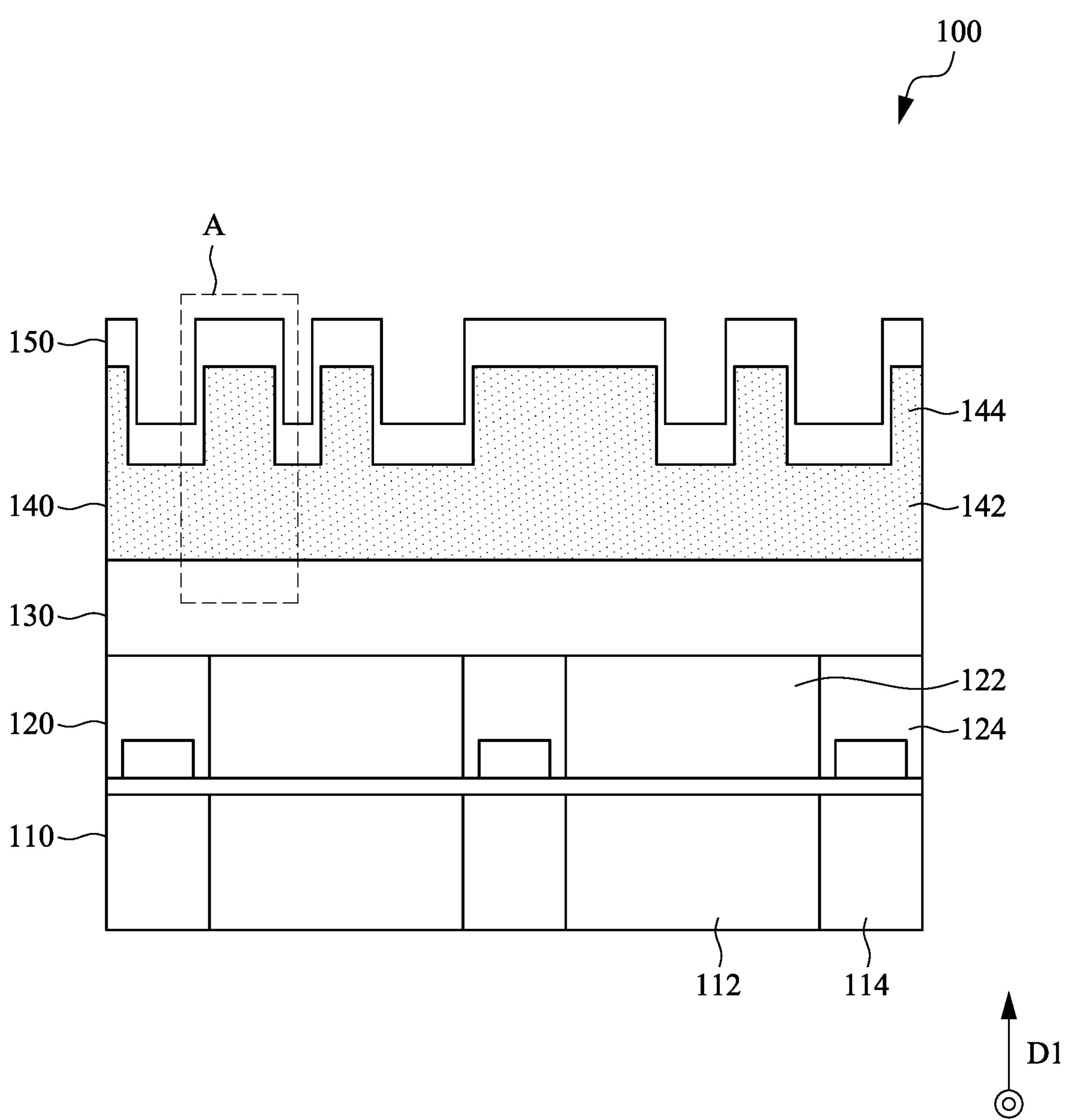
FIG. 2 is a cross-sectional view of the image sensor according to some embodiments of the disclosure.

Reference is made to FIG. 1 and FIG. 2. FIG. 1 is a schematic top view of an image sensor according to some embodiments of the disclosure, and FIG. 2 is a cross-sectional view of the image sensor according to some embodiments of the disclosure. The image sensor 100 includes a photoelectric conversion layer 110, a color filter layer 120 disposed on the photoelectric conversion layer 110, a buffer layer 130 disposed on the color filter layer 120, a meta layer 140 disposed on the buffer layer 130, and an anti-reflective layer 150 coated on the meta layer 140.

The photoelectric conversion layer 110 includes a plurality of photodiodes 112 and a deep trench isolation structure 114. The deep trench isolation structure 114 separates the photodiodes 112. The color filter layer 120 includes a plurality of color filter regions 122 surrounded by a grid structure 124. The color filter regions 122 are disposed on the corresponding photodiodes 112, respectively. The buffer layer 130 is disposed between the color filter layer 120 and the meta layer 140.

The meta layer 140 includes a lining layer 142 on the buffer layer 130 and a plurality of top nano-structures 144. The top nano-structures 144 are protruded from the lining layer 142 in a direction D1 away from the photoelectric conversion layer 110. The lining layer 142 and the top nano-structures 144 are made of the same material and are integrally formed as one single piece. The lining layer 142 is continuously covered on the buffer layer 130 and has a uniform thickness.

In some embodiments, the dimensions of the top nano-structures 144, the pitches between the top nano-structures 144, and/or the densities of the top nano-structures 144 on a single color filter region 122 can be varied according to optical design requirements. The anti-reflective layer 150 is non-conformally coated on the top nano-structures 144 of the meta layer 140. In some embodiments, a refractive index of the meta layer 140 is greater than a refractive index of the anti-reflective layer 150, and the refractive index of the anti-reflective layer 150 is greater than 1. In some embodiments, the material of the anti-reflective layer 150 includes inorganic oxides, resin, polyimide, acrylate, poly-vinyl alcohol, or photoresist.

Figure 3:
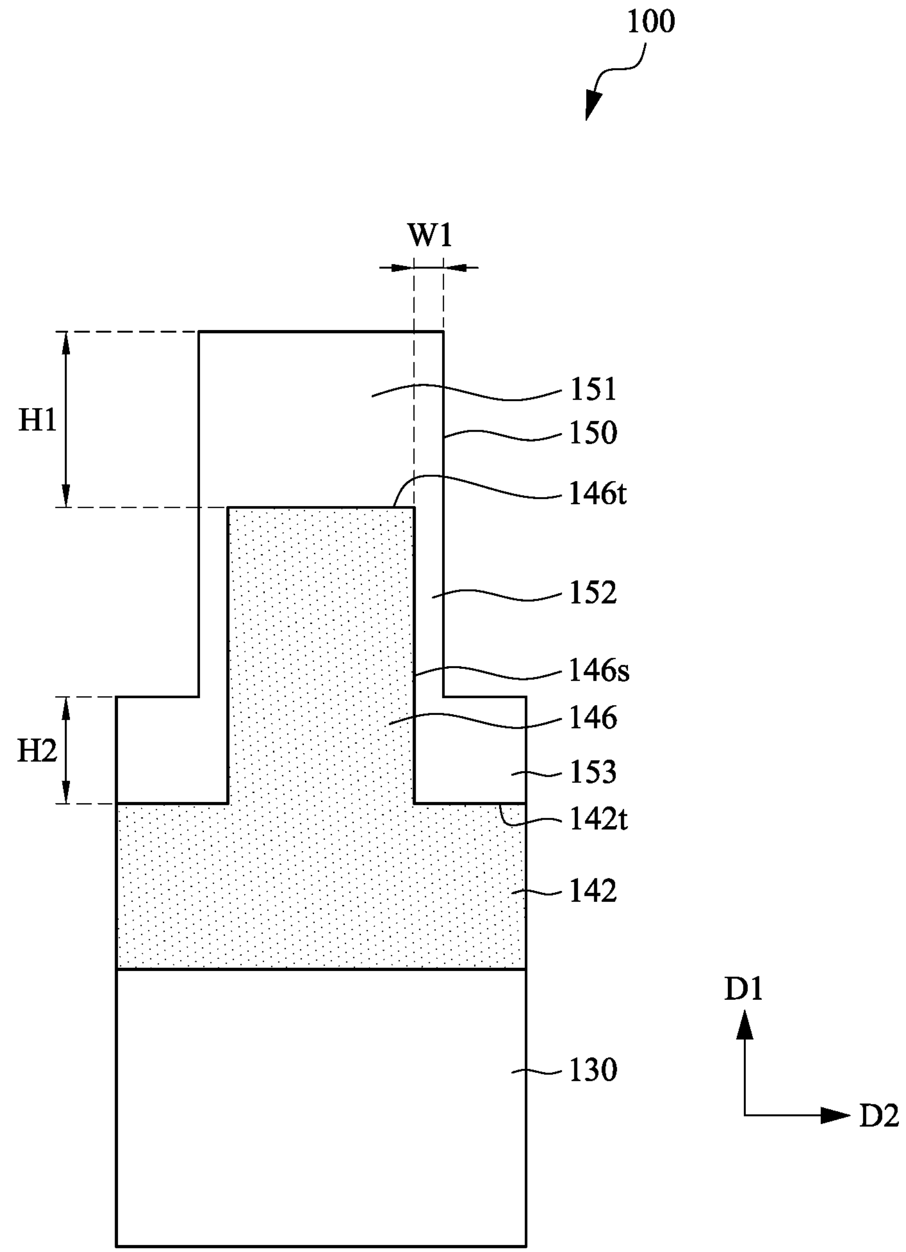
FIG. 3 is a partial view of region A of the image sensor of FIG. 2.

Reference is further made to FIG. 3. FIG. 3 is a partial view of region A of the image sensor 100 of FIG. 2, in which region A illustrates a first nano-structure of the top nano-structures of the image sensor according to some embodiments of the disclosure. For example, the anti-reflective layer 150 has a first portion 151 on a top surface 146*t* of the first nano-structure 146 and a second portion 152 on a sidewall 146*s* of the first nano-structure 146, and a height H1 of the first portion 151 is greater than a width W1 of the second portion 152. The height H1 is measured at a center of the top surface 146*t* of the first nano-structure 146 in the direction D1 away from the photoelectric conversion layer 110 (as shown in FIG. 2), and the width W1 is measured at a middle of the sidewall 146*s* of the first nano-structure 146 in a direction D2 that perpendicular to the direction D1 away from the photoelectric conversion layer 110. In some embodiments, the ratio of the height H1 of the first portion 151 to the width W1 of the second portion 152 is greater than 1.2. In some embodiments, the ratio of the height H1 of the first portion 151 to the width W1 of the second portion 152 is greater than 1.5 in order to provide better performance.

The anti-reflective layer 150 further has a third portion 153 on a top surface 142*t* of the lining layer 142, and a height H2 of the third portion 153 is also greater than the width W1 of the second portion 152. In some embodiments, the ratio of the height H2 of the third portion 153 to the width W1 of the second portion 152 is greater than 1.3. In some embodiments, the ratio of the height H2 of the third portion 153 to the width W1 of the second portion 152 is greater than 1.7 in order to provide better performance. The height H1 of the first portion 151 can be equal to, greater than, or smaller than the height H2 of the third portion 153.

Figure 4A:
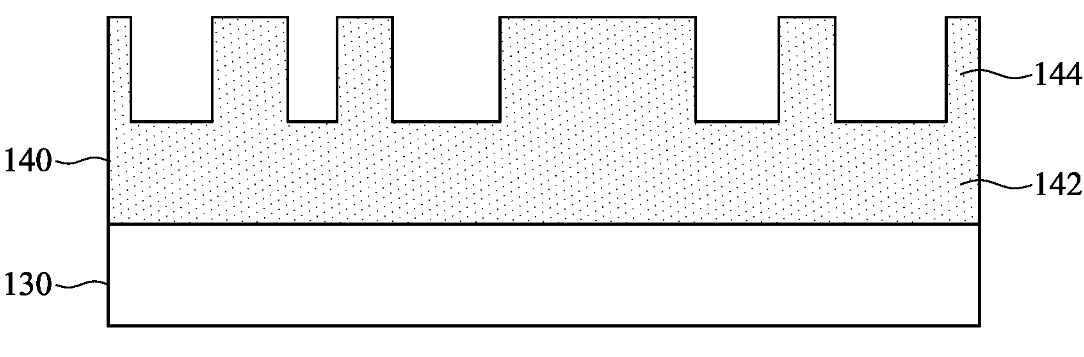
FIG. 4A to FIG. 4C are schematic views of different steps of forming the anti-reflective layer on the meta layer according to some embodiments of the disclosure.
Figure 4B:
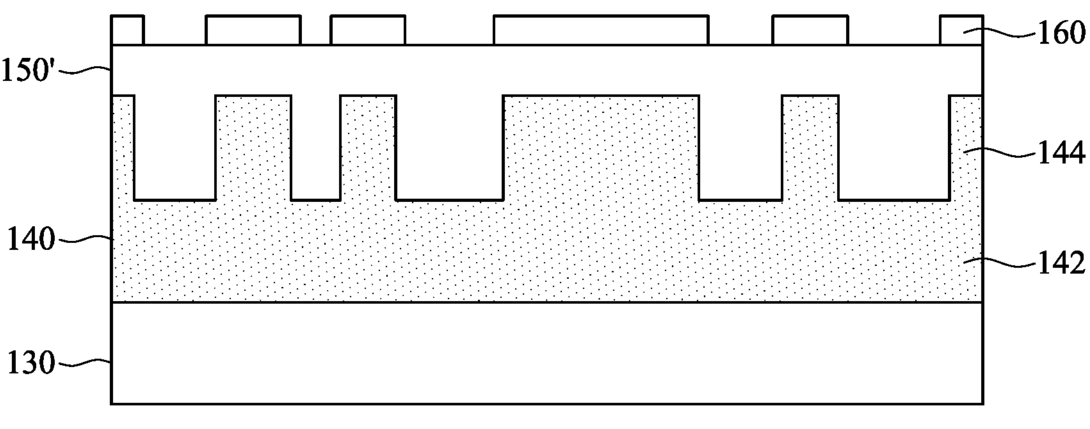
Figure 4C:
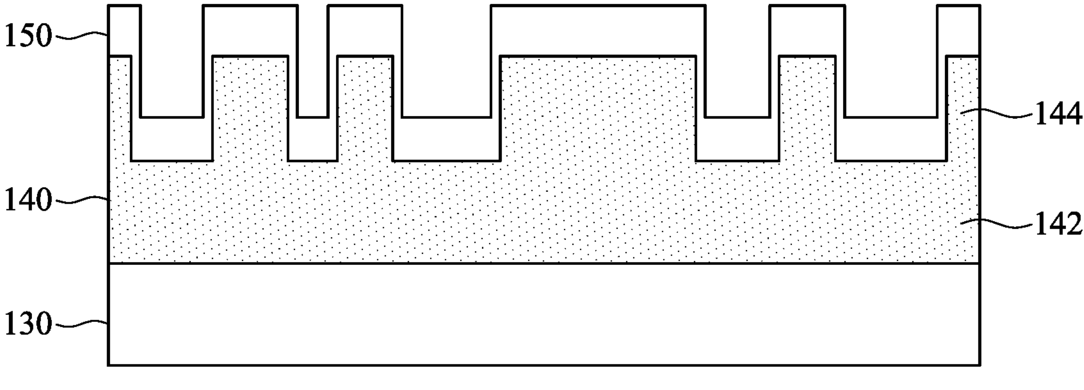

Reference is made to FIG. 4A to FIG. 4C, which are schematic views of different steps of forming the anti-reflective layer on the meta layer 140 according to some embodiments of the disclosure. As shown in FIG. 4A, the meta layer 140 is formed on the buffer layer 130, in which the meta layer 140 includes the lining layer 142 on the buffer layer 130 and the top nano-structures 144 on the lining layer 142.

As shown in FIG. 4B, a low-refractive material 150' is deposited on the meta layer 140. The refractive index of the low-refractive material 150' is less than the refractive index of the meta layer 140, and the refractive index of the low-refractive material 150' is greater than 1. In some embodiments, the low-refractive material 150' fills the space between the top nano-structures 144 and provides a flat top surface. The material of the low-refractive material 150' for example, can be inorganic oxides, resin, polyimide, acrylate, poly-vinyl alcohol, or photoresist.

Then hard mask patterns 160 are formed on the low-refractive material 150'. The hard mask patterns 160 are formed on the corresponding top nano-structures 144. The projections of the hard mask patterns 160 on the buffer layer 130 cover the projections of the top nano-structures 144 on the buffer layer 130, respectively. More particularly, the projections of the hard mask patterns 160 are greater than the projections of the corresponding top nano-structures 144.

After the hard mask patterns 160 are formed on the top nano-structures 144, and etching the low-refractive material 150' using the hard mask patterns 160 as a mask. The portions of the low-refractive material 150' covered by the hard mask patterns 160 are protected during the etching process, and the portions of the low-refractive material 150' not covered by the hard mask patterns 160 are removed after the during the etching process. In some embodiments, the hard mask patterns 160 are removed after the etching process. In some other embodiments, the hard mask patterns 160 are consumed during the etching process.

As a result, as shown in FIG. 4C, the remaining low-refractive material becomes the anti-reflective layer 150 covering the meta layer 140. The anti-reflective layer 150 covers the lining layer 142 and the top nano-structures 144 of the meta layer 140. The portions of the anti-reflective layer 150 on the top surfaces of the lining layer 142 and the top nano-structures 144 are thicker than the portions of the anti-reflective layer 150 on the sidewalls of the top nano-structures 144.

Figure 5:
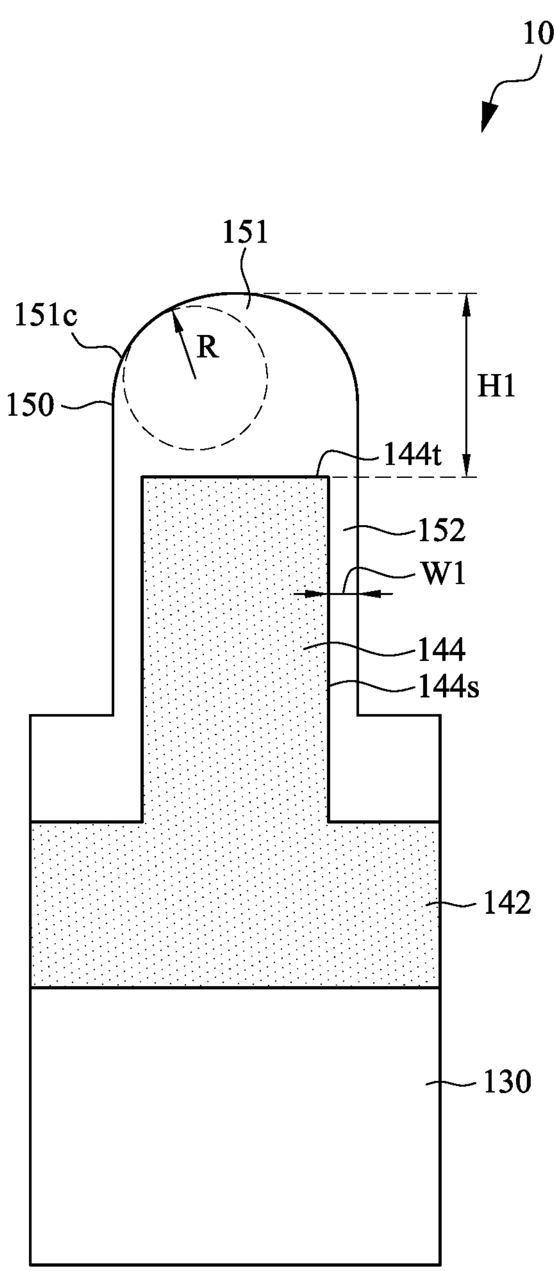
FIG. 5 to FIG. 11 are partial cross-sectional views of the image sensor according to different embodiments of the disclosure.

Reference is made to FIG. 5 to FIG. 8, which are partial cross-sectional views of different embodiments of the image sensor of the disclosure. In some embodiments, the shape of the anti-reflective layer 150 on the top nano-structure 144 can be modified according to the selected etching process. For example, as shown in FIG. 5, the anti-reflective layer 150 has the first portion 151 on the top surface 144*t* of the top nano-structure 144 and the second portion 152 on the sidewall 144*s* of the top nano-structure 144, in which the height H1 of the first portion 151 is greater than the width W1 of the second portion 152. The first portion 151 has a rounded corner 151*c*, and a radius R of curvature of the rounded corner 151*c* is less than the height H1 of the first portion 151. The top surface of the first portion 151 has a dome shape.

Figure 6:
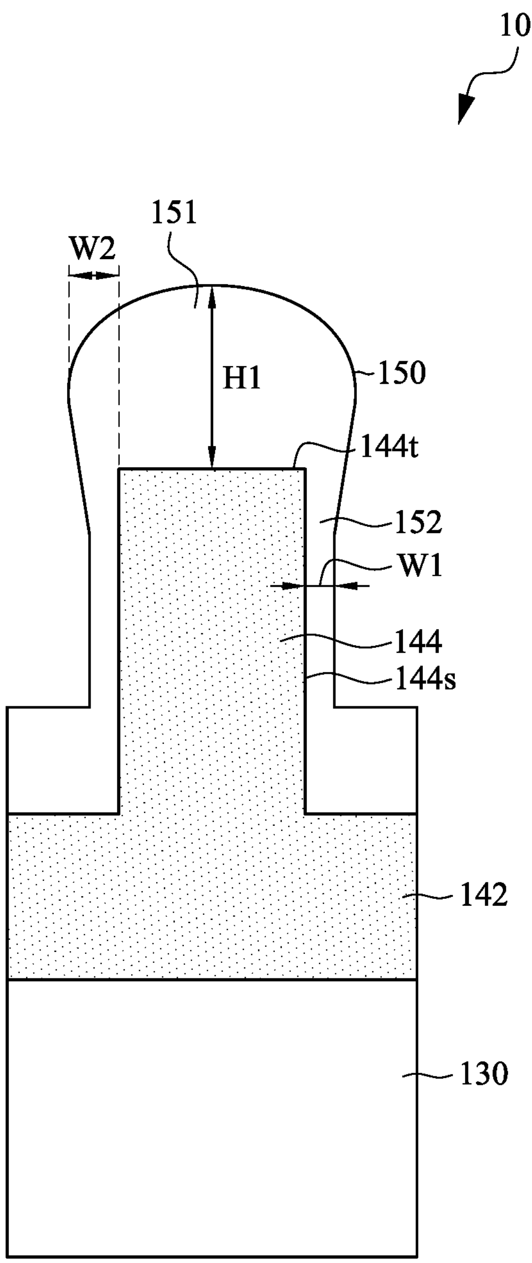

Alternatively, as shown in FIG. 6, the anti-reflective layer 150 has the first portion 151 on the top surface 144*t* of the top nano-structure 144 and the second portion 152 on the sidewall 144*s* of the top nano-structure 144, in which the height H1 of the first portion 151 is greater than the width W1 of the second portion 152. The first portion 151 has a round head portion 151*h* laterally protruded from the second portion 152. That is, the width W2 of the first portion 151 measured from the sidewall 144*s* of the top nano-structure 144 is greater than the width W1 of the second portion 152 measured from the sidewall 144*s* of the top nano-structure 144. The top surface of the first portion 151 has a dome shape.

Figure 7:
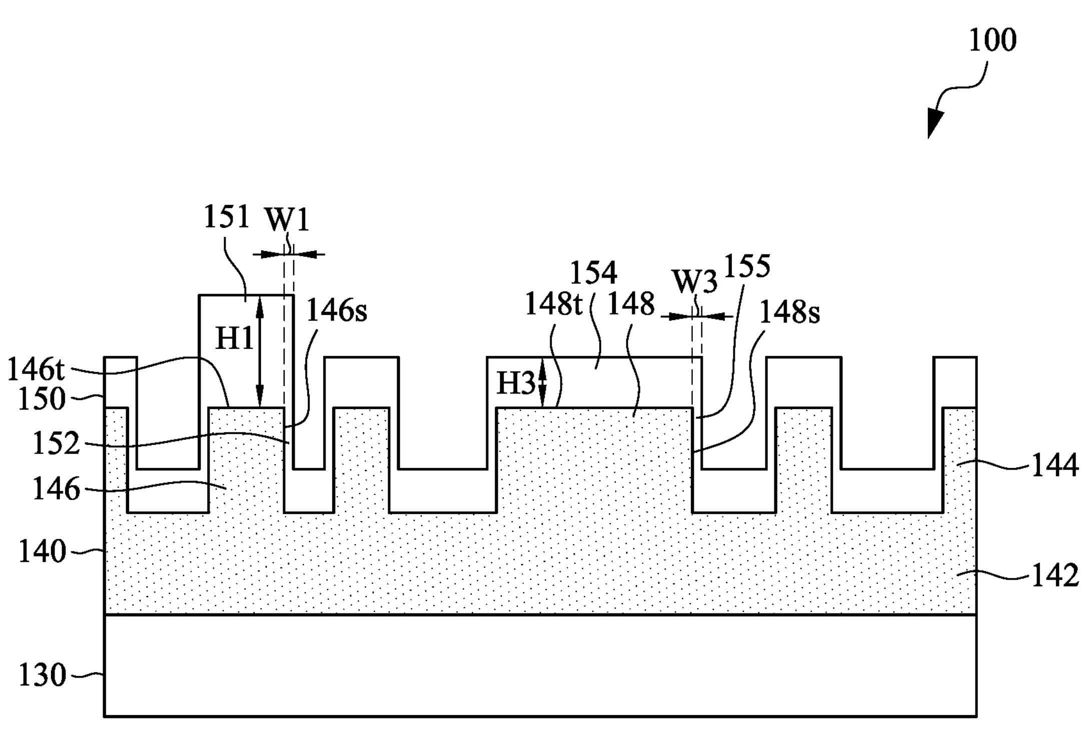

Alternatively, as shown in FIG. 7, in some embodiments, aspect ratios of the anti-reflective layer 150 on the different top nano-structures 144 can be the same or different. For example, the top nano-structures 144 include a first nano-structure 146 and a second nano-structure 148. The first nano-structure 146 and the second nano-structure 148 can have the same or different dimensions. The first nano-structure 146 and the second nano-structure 148 can be on the same or different color filter regions. The first nano-structure 146 and the second nano-structure 148 can be adjacent or spaced apart by other top nano-structures 144.

The anti-reflective layer 150 has the first portion 151 on the top surface 146*t* of the first nano-structure 146 and the second portion 152 on the sidewall 146*s* of the first nano-structure 146, in which the height H1 of the first portion 151 is greater than the width W1 of the second portion 152. The anti-reflective layer 150 also has a fourth portion 154 on the top surface 148*t* of the second nano-structure 148 and a fifth portion 155 on the sidewall 148*s* of the second nano-structure 148. The height H3 of the fourth portion 154 is greater than the width W3 of the fifth portion 155.

In some embodiments, a first ratio of the height H1 of the first portion to the width W1 of the second portion 152 is equal to a second ratio of the height H3 of the fourth portion 154 to the width W3 of the fifth portion 155.

In some other embodiments, a first ratio of the height H1 of the first portion to the width W1 of the second portion 152 is greater than a second ratio of the height H3 of the fourth portion 154 to the width W3 of the fifth portion 155. In some embodiments, the aspect ratios (height/width) of the anti-reflective layer 150 on the different top nano-structures 144 can more than two.

Figure 8:
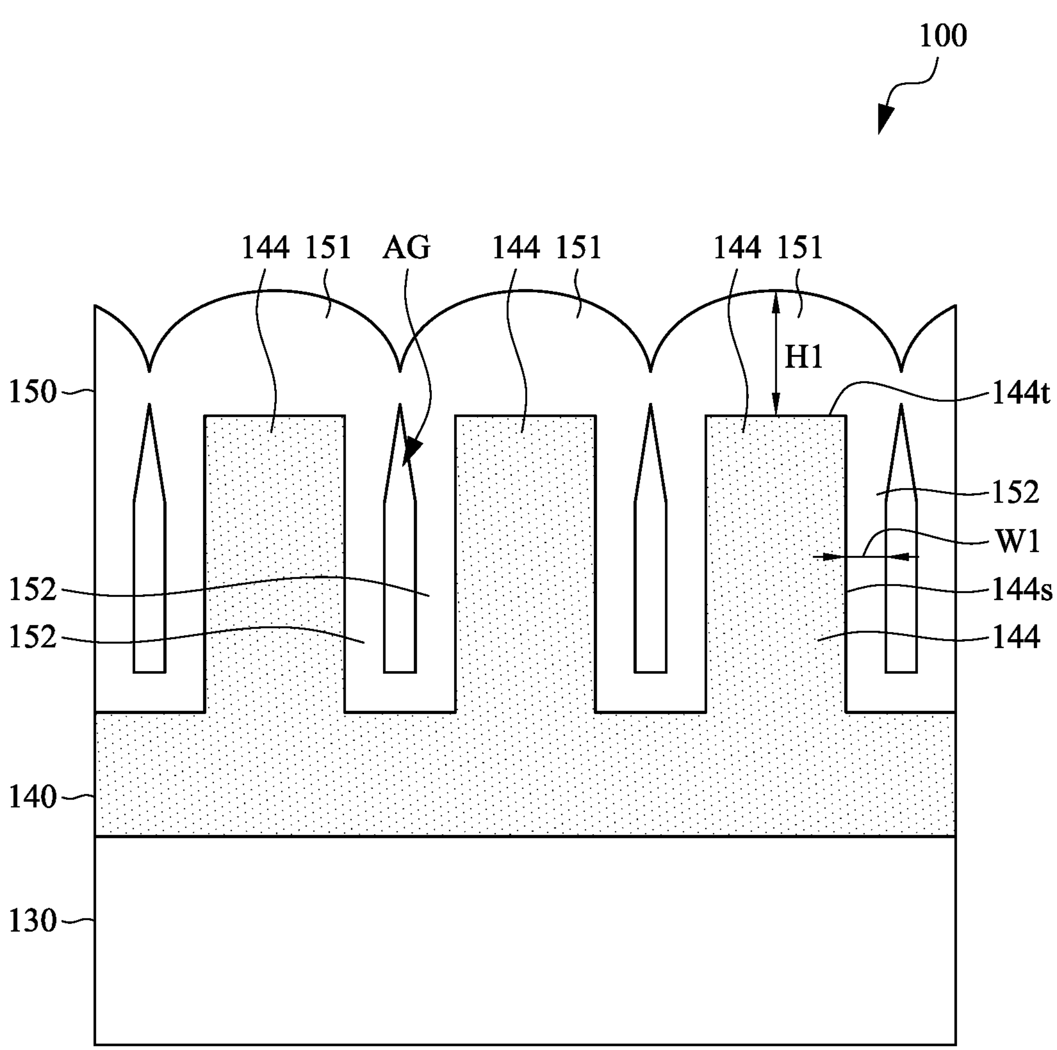

Alternatively, as shown in FIG. 8, the anti-reflective layer 150 has the first portions 151 on the top surfaces 144*t* of the top nano-structure 144 and the second portions 152 on the sidewalls 144*s* of the top nano-structures 144, respectively. The height H1 of each of the first portions 151 is greater than the width W1 of each of the second portions 152. The anti-reflective layer 150 is partially connected on the adjacent top nano-structures 144, and air cavities AG encircled by the anti-reflective layer 150 are defined between the adjacent top nano-structures 144. More particularly, the first portions 151 of the anti-reflective layer 150 are connected above the air cavities AG, and the second portions 152 of the anti-reflective layer 150 are spaced apart from each other by the air cavities AG.

Figure 9:
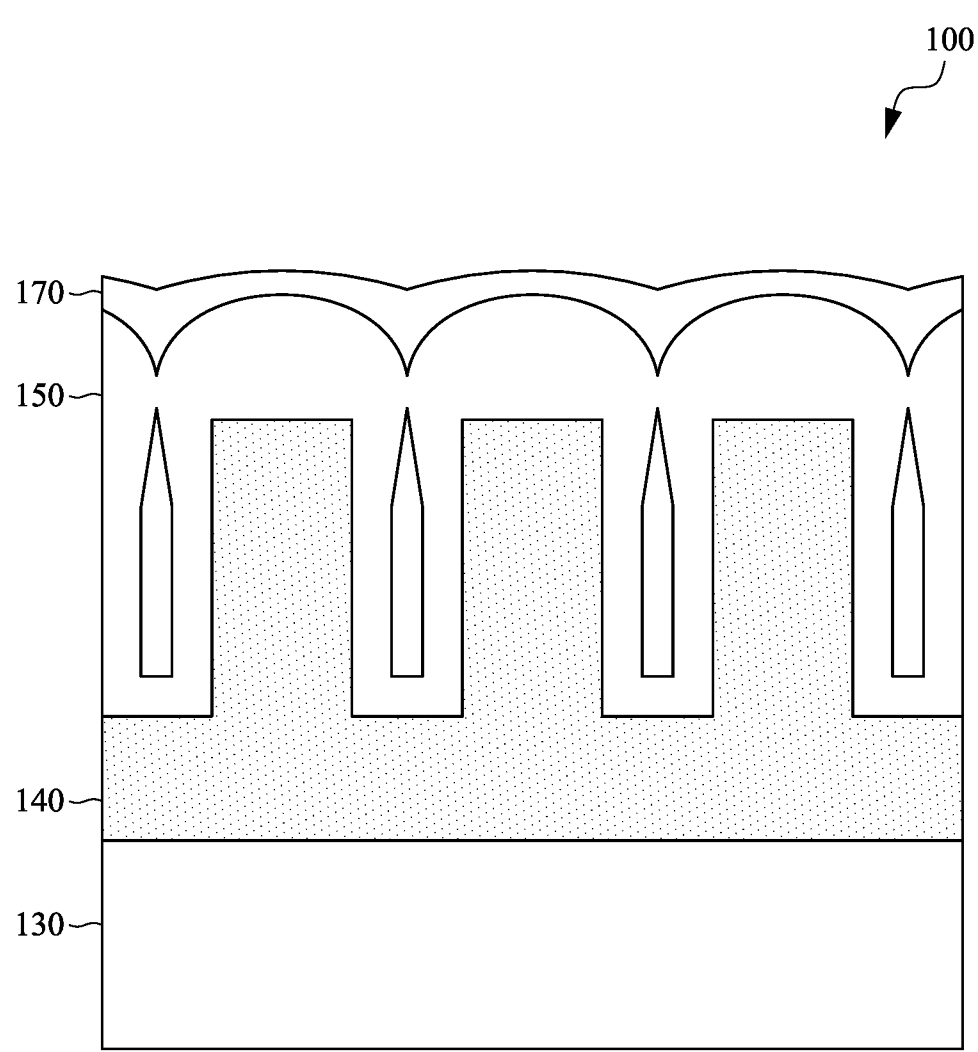
Figure 10:
Figure 10:
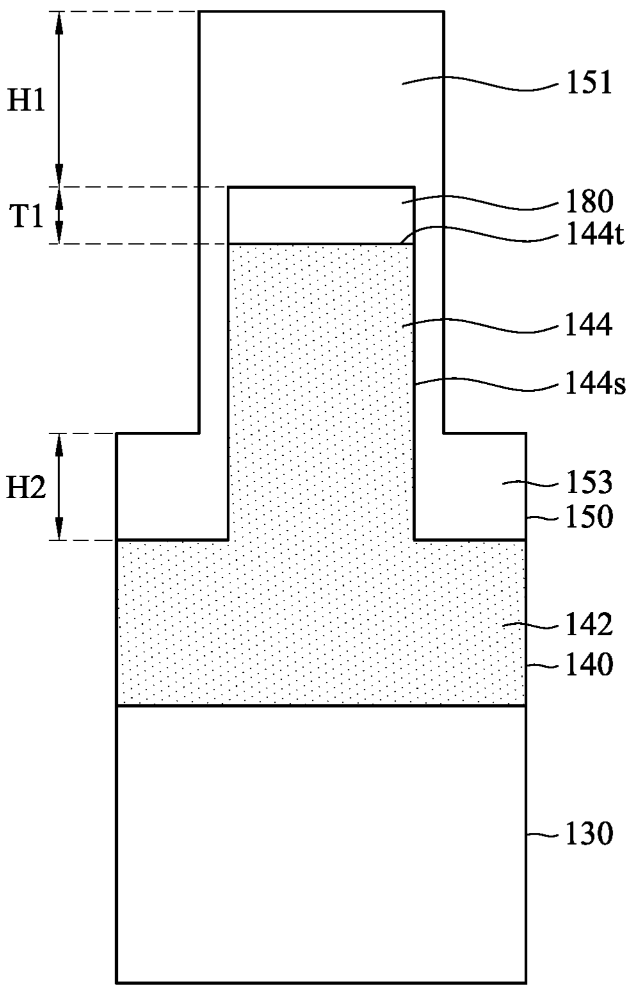
Figure 11:
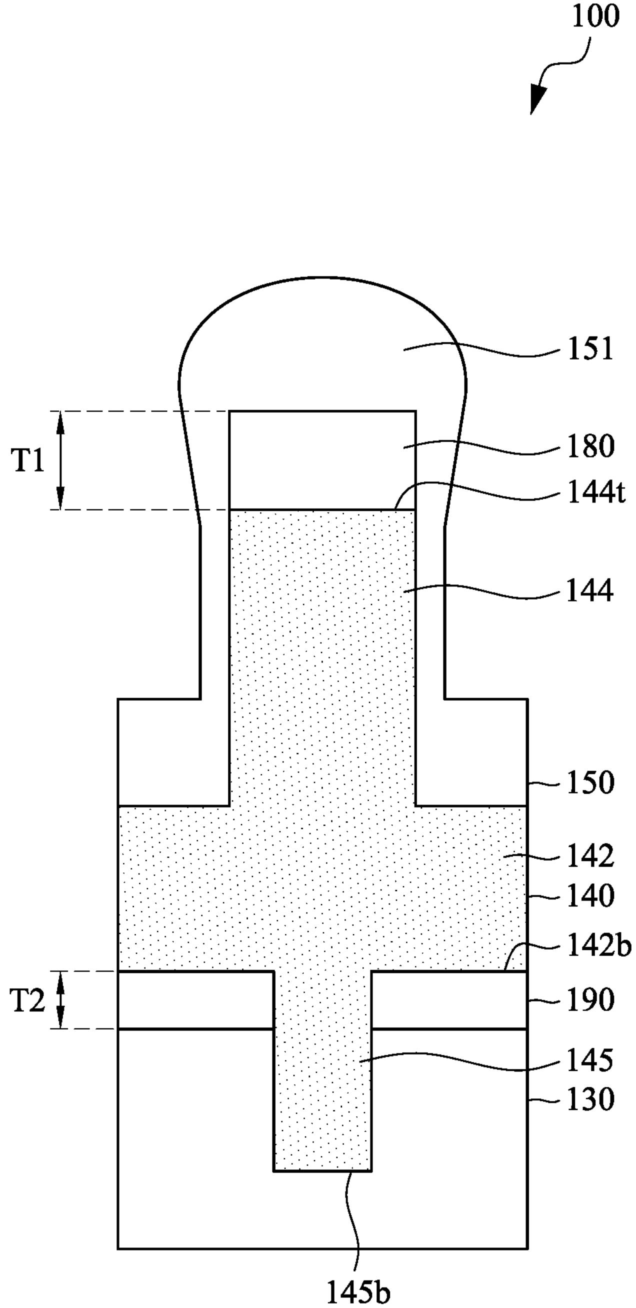

Reference is made to FIG. 9 to FIG. 11, which are partial cross-sectional views of the image sensor according to different embodiments of the disclosure. In some embodiments, as shown in FIG. 9, the image sensor 100 further includes a protective layer 170 on the anti-reflective layer 150. The refractive index of the anti-reflective layer 150 is greater than the refractive index of the protective layer 170, and the refractive index of the protective layer 170 is greater than 1. In some embodiments, the protective layer 170 provides a flat top surface for the following manufacturing processes.

Alternatively, as shown in FIG. 10, the image sensor 100 further includes a top index matching layer 180 between the anti-reflective layer 150 and the top surface 144*t* of the top nano-structure 144. The refractive index of the meta layer 140 is greater than a refractive index of the top index matching layer 180, and the refractive index of the top index matching layer 180 is greater than or equal to the refractive index of the anti-reflective layer 150. In some embodiments, the top index matching layer 180 is disposed between the anti-reflective layer 150 and the top surface 144*t* of the top nano-structure 144, and the sidewall 144*s* of the top nano-structure 144 is directly in contact with the anti-reflective layer 150. The sum of the height H1 of the first portion 151 of the anti-reflective layer 150 and the thickness T1 of the top index matching layer 180 is greater than the height H2 of the third portion 153 of the anti-reflective layer 150.

Alternatively, as shown in FIG. 11, the shape of the first portion 151 of the anti-reflective layer 150 can be modified such as having a rounded corner or a round head portion. In some embodiments, the meta layer 140 further includes bottom nano-structure 145 protruded from the lining layer 142 in a direction opposite to the top nano-structure 144. The bottom nano-structure 145 can be align with or misalign the top nano-structure 144.

Optionally, the image sensor 100 further includes a bottom index matching layer 190 between the buffer layer 130 and a bottom surface 142*b* of the lining layer 142 of the meta layer 140. The refractive index of the meta layer 140 is greater than a refractive index of the bottom index matching layer 190, and the refractive index of the bottom index matching layer 190 is greater than or equal to a refractive index of the buffer layer 130. In some embodiments, the thickness T2 of the bottom index matching layer 190 is smaller than or equal to the thickness T1 of the top index matching layer 180. In some embodiments, the bottom surface 145*b* of the bottom nano-structure 145 is directly in contact with the buffer layer 130.

Figure 12:
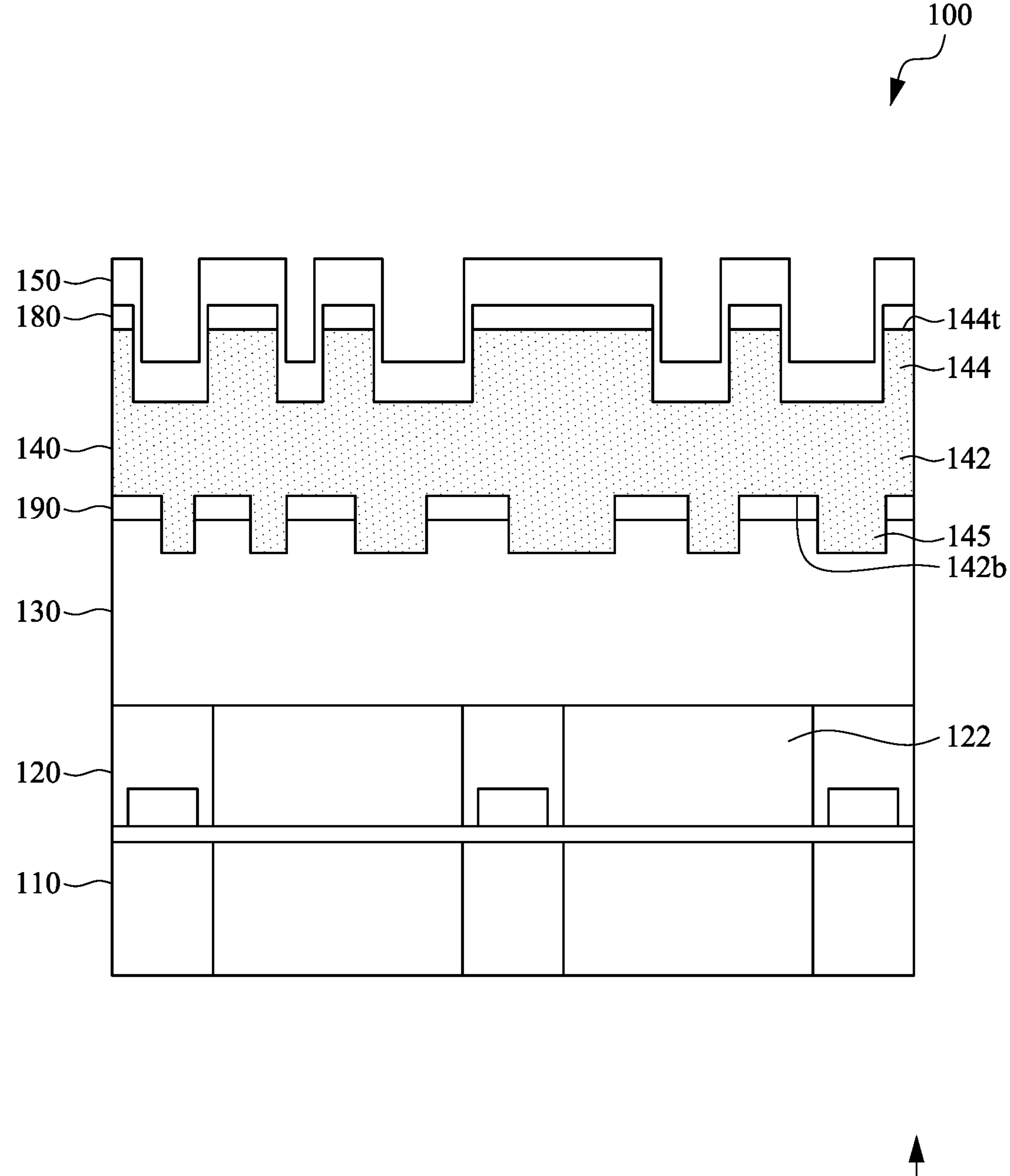
FIG. 12 to FIG. 15 are cross-sectional views of the image sensor according to different embodiments of the disclosure.

Reference is made to FIG. 12 to FIG. 15, which are cross-sectional views of the image sensor according to different embodiments of the disclosure. As shown in FIG. 12, the image sensor 100 includes the photoelectric conversion layer 110, the color filter layer 120 disposed on the photoelectric conversion layer 110, the buffer layer 130 disposed on the color filter layer 120, the meta layer 140 disposed on the buffer layer 130, and the anti-reflective layer 150 non-conformally coated on the meta layer 140.

The meta layer 140 includes the lining layer 142 on the buffer layer 130 and the top nano-structures 144. The top nano-structures 144 are protruded from the lining layer 142 in the direction D1 away from the photoelectric conversion layer 110. The meta layer 140 further includes the bottom nano-structures 145 that are protruded from the lining layer 142 in the direction D3 towards the photoelectric conversion layer 110. The bottom nano-structures 145 can be align with or misalign the top nano-structures 144.

In some embodiments, the dimensions of the top nano-structures 144 and the bottom nano-structures 145, the pitches between the top nano-structures 144 and the bottom nano-structures 145, and/or the densities of the top nano-structures 144 and the bottom nano-structures 145 on a single color filter region 122 can be varied according to optical design requirements. The anti-reflective layer 150 is non-conformally coated on the top nano-structures 144 of the meta layer 140. In some embodiments, the aspect ratios (height/width) of the anti-reflective layer 150 on the different top nano-structures 144 can be varied according to optical design requirements.

The image sensor 100 further includes the top index matching layer 180 between the anti-reflective layer 150 and the top surface 144*t* of the top nano-structure 144 and the bottom index matching layer 190 between the buffer layer 130 and the bottom surface 142*b* of the lining layer 142 of the meta layer 140. In some embodiments, the refractive index of the meta layer 140 is greater than the refractive index of the top index matching layer 180, the refractive index of the top index matching layer 180 is greater than or equal to the refractive index of the anti-reflective layer 150, and the refractive index of the anti-reflective layer 150 is greater than 1. The refractive index of the meta layer 140 is greater than the refractive index of the bottom index matching layer 190, and the refractive index of the bottom index matching layer 190 is greater than or equal to a refractive index of the buffer layer 130.

Figure 13:
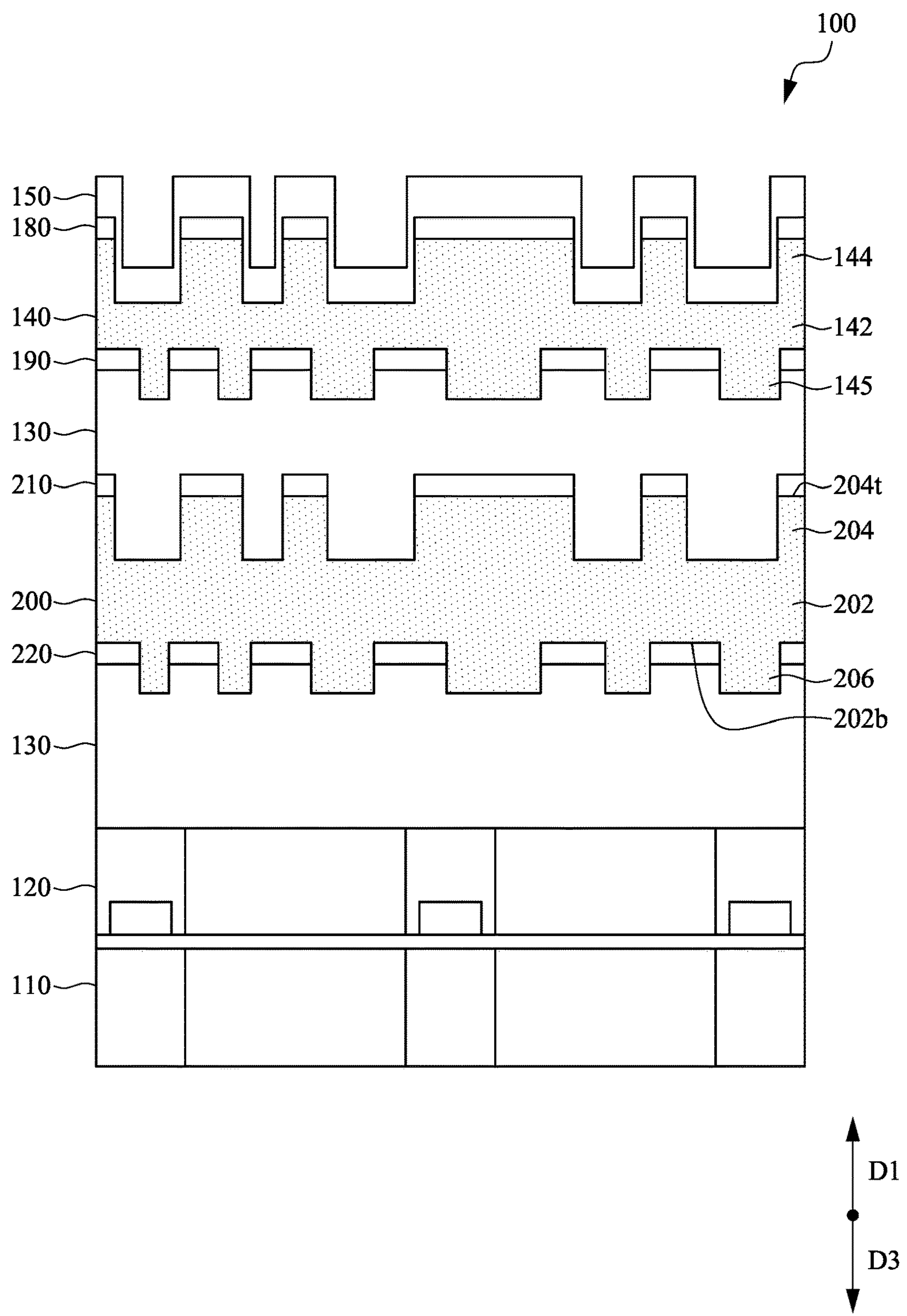

As shown in FIG. 13, the image sensor 100 has double meta layers. The image sensor 100 further includes an inter meta layer 200 disposed in the buffer layer 130. The inter meta layer 200 is disposed below the meta layer 140. In some embodiments, the inter meta layer 200 includes a lining layer 202, a plurality of top nano-structures 204 protruded from the lining layer 202 in the direction D1 away from the photoelectric conversion layer 110 and a plurality of bottom nano-structures 206 protruded from the lining layer 202 in the direction D3 towards the photoelectric conversion layer 110. The arrangement of the top nano-structures 204 and the bottom nano-structures 206 of the inter meta layer 200 can be same as the arrangement of the top nano-structures 144 and the bottom nano-structures 145 of the inter meta layer 140.

The image sensor 100 further includes an inter top index matching layer 210 between the buffer layer 130 and a top surface 204*t* of top nano-structures 204 of the inter meta layer 200. The image sensor 100 further includes an inter bottom index matching layer 220 between the buffer layer 130 and a bottom surface 202*b* of the lining layer 202 of the inter meta layer 200.

Figure 14:
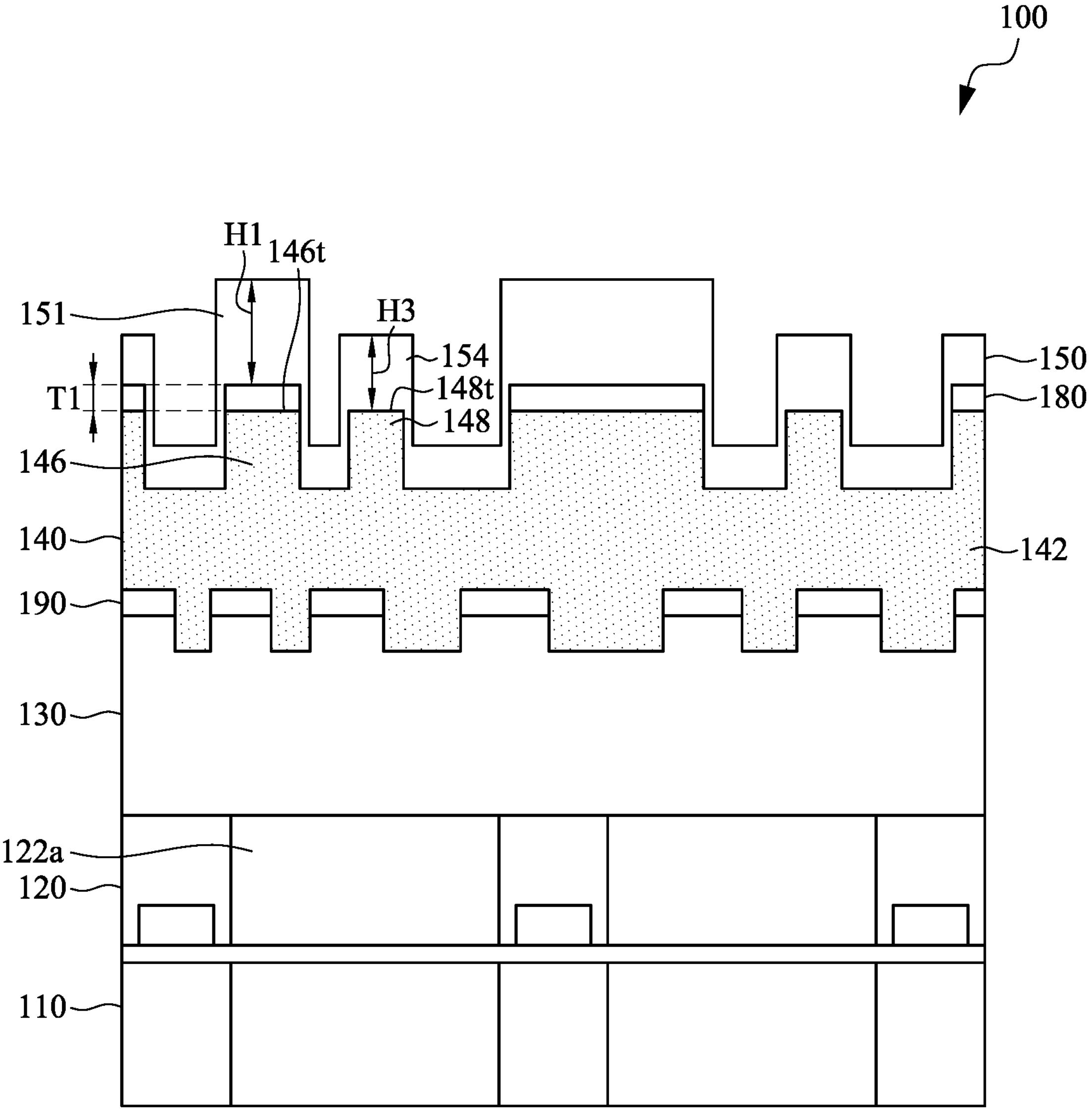

As shown in FIG. 14, the design of the anti-reflective layer 150 and the top index matching layer 180 can be varied in a single color filter region. For example, the meta layer 140 includes the first nano-structure 146 and the second nano-structure 148 on the single color filter region 122*a*. The top index matching layer 180 is disposed between the anti-reflective layer 150 and the top surface 146*t* of the first nano-structure 146, and the anti-reflective layer 150 is directly in contact with the top surface 148*t* of the second nano-structure 148.

In some embodiments, the anti-reflective layer 150 includes the fourth portion 154 on the top surface 148*t* of the second nano-structure 148, and a sum of the thickness T1 of the top index matching and the height H1 of the first portion 151 is greater than a height H3 of the fourth portion 154.

Figure 15:
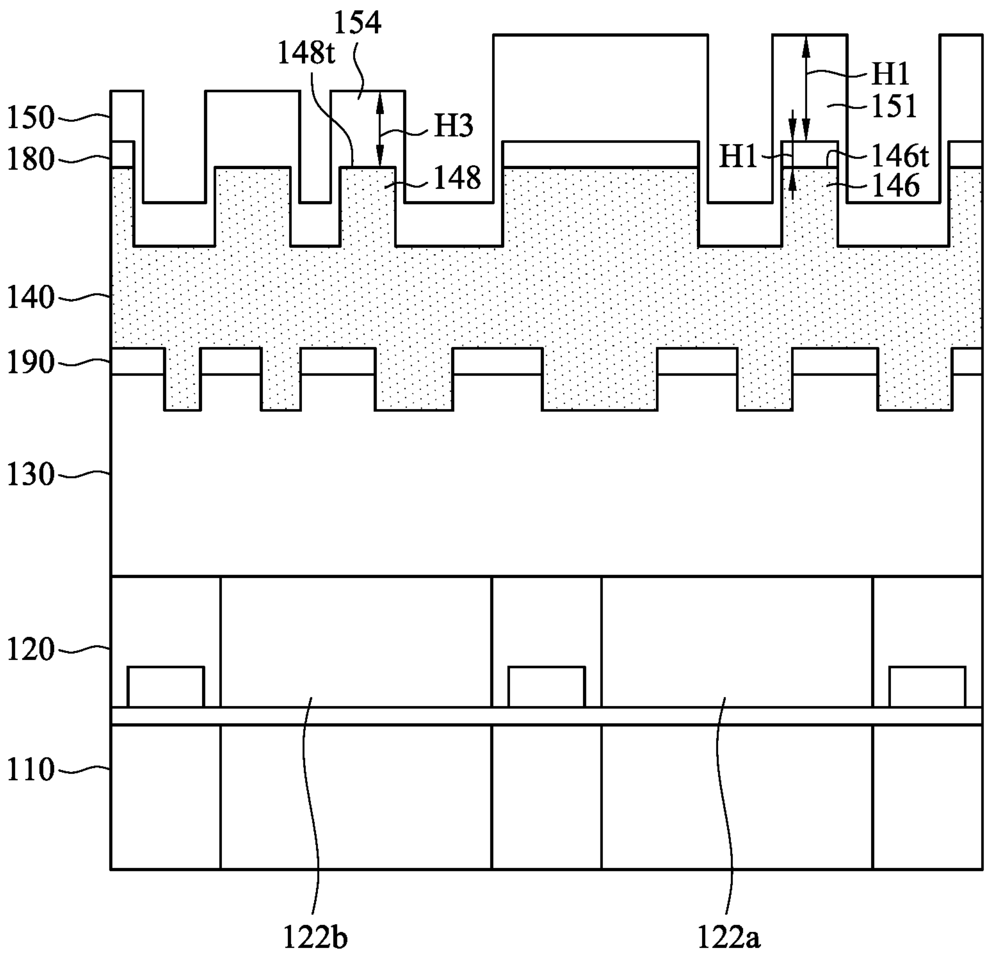

As shown in FIG. 15, the design of the anti-reflective layer 150 and the top index matching layer 180 can be varied in different color filter regions. For example, the meta layer 140 includes the first nano-structure 146 on a first color filter region 122*a* and the second nano-structure 148 on a second color filter region 122*b*. The waveband of the first color filter region 122*a* is different from the waveband of the second color filter region 122*b*.

The top index matching layer 180 is disposed between the anti-reflective layer 150 and the top surface 146*t* of the first nano-structure 146, and the anti-reflective layer 150 is directly in contact with the top surface 148*t* of the second nano-structure 148.

In some embodiments, the anti-reflective layer 150 includes the fourth portion 154 on the top surface 148*t* of the second nano-structure 148, and a sum of the thickness T1 of the top index matching and the height H1 of the first portion 151 is greater than a height H3 of the fourth portion 154.

The image sensor of the embodiments of the disclosure includes meta layer having nano-structures on the photoelectric conversion layer and an anti-reflective layer coated on the nano-structures to reduce the reflectivity of the nano-structures. The anti-reflective layer is non-conformally coated on the nano-structures of the meta layer to further reduce the reflectivity and increase optical effect.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An image sensor, comprising:

a photoelectric conversion layer;

a color filter layer disposed on the photoelectric conversion layer;

a buffer layer disposed on the color filter layer;

a meta layer comprising a lining layer on the buffer layer and a plurality of top nano-structures protruded from the lining layer in a direction away from the photoelectric conversion layer; and an anti-reflective layer coated on the meta layer, wherein the anti-reflective layer comprises a first portion on a top surface of a first nano-structure of the top nano-structures and a second portion on a sidewall of the first nano-structure, and a height of the first portion is greater than a width of the second portion.

2. The image sensor of claim 1, wherein the height is measured at a center of the top surface of the first nano-structure in the direction away from the photoelectric conversion layer, and the width is measured at a middle of the sidewall of the first nano-structure in a direction that perpendicular to the direction away from the photoelectric conversion layer.

3. The image sensor of claim 1, wherein the anti-reflective layer comprises a third portion on a top surface of the lining layer, and a height of the third portion is greater than the width of the second portion.

4. The image sensor of claim 3, wherein a ratio of the height of the first portion to the width of the second portion is greater than or equal to 1.2, and a ratio of the height of the third portion to the width of the second portion is greater than or equal to 1.3.

5. The image sensor of claim 3, wherein a ratio of the height of the first portion to the width of the second portion is greater than or equal to 1.5, and a ratio of the height of the third portion to the width of the second portion is greater than or equal to 1.7.

6. The image sensor of claim 1, wherein the first portion has a rounded corner, and a radius of curvature of the rounded corner is less than the height of the first portion.

7. The image sensor of claim 1, wherein the first portion has a round head portion laterally protruded from the second portion.

8. The image sensor of claim 1, wherein the anti-reflective layer is partially connected on the adjacent top nano-structures, and an air cavity encircled by the anti-reflective layer is between the adjacent top nano-structures.

9. The image sensor of claim 1, further comprising a protective layer on the anti-reflective layer, a refractive index of the anti-reflective layer is greater than a refractive index of the protective layer, and the refractive index of the protective layer is greater than 1.

10. The image sensor of claim 1, further comprising a top index matching layer between the anti-reflective layer and a top surface of the first nano-structure, a refractive index of the meta layer is greater than a refractive index of the top index matching layer, and the refractive index of the top index matching layer is greater than or equal to a refractive index of the anti-reflective layer.

11. The image sensor of claim 10, further comprising a bottom index matching layer between the buffer layer and a bottom surface of the lining layer, a refractive index of the meta layer is greater than a refractive index of the bottom index matching layer, and the refractive index of the bottom index matching layer is greater than or equal to a refractive index of the buffer layer.

12. The image sensor of claim 11, wherein a thickness of the bottom index matching layer is smaller than or equal to a thickness of the top index matching layer.

13. The image sensor of claim 1, further comprising a top index matching layer between the anti-reflective layer and a top surface of the first nano-structure, wherein the anti-reflective layer is directly in contact with a top surface of a second nano-structure of the top nano-structures.

14. The image sensor of claim 13, wherein the first nano-structure and the second nano-structure are located on a color filter region of the color filter layer.

15. The image sensor of claim 13, wherein the first nano-structure and the second nano-structure are located on different color filter regions of the color filter layer, respectively.

16. The image sensor of claim 13, wherein the anti-reflective layer comprises a fourth portion on a top surface of the second nano-structure, and a sum of a thickness of the top index matching and the height of the first portion is greater than a height of the fourth portion.

17. The image sensor of claim 1, wherein the anti-reflective layer comprises a fourth portion on a top surface of a second nano-structure of the top nano-structures and a fifth portion on a sidewall of the second nano-structure, a height of the fourth portion is greater than a width of the fifth portion, and a first ratio of the height of the first portion to the width of the second portion is greater than a second ratio of the height of the fourth portion to the width of the fifth portion.

18. The image sensor of claim 1, wherein a refractive index of the meta layer is greater than a refractive index of the anti-reflective layer, and the refractive index of the anti-reflective layer is greater than 1.

19. The image sensor of claim 1, wherein the meta layer comprises a plurality of bottom nano-structures protruded from the lining layer in a direction towards the photoelectric conversion layer, and the bottom nano-structures misalign the top nano-structures.

20. The image sensor of claim 1, further comprising:

an inter meta layer disposed in the buffer layer;

an inter top index matching layer between the buffer layer and a top surface of a top nano-structure of the inter meta layer; and an inter bottom index matching layer between the buffer layer and a bottom surface of a lining layer of the inter meta layer.

* * * * *